United States Patent
Farnworth et al.

(12)

(10) Patent No.: US 6,414,374 B2
(45) Date of Patent: Jul. 2, 2002

(54) SEMICONDUCTOR DEVICE INCLUDING EDGE BOND PADS AND METHODS

(75) Inventors: Warren M. Farnworth, Nampa; Larry D. Kinsman, Boise; Walter L. Moden, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/862,942

(22) Filed: May 22, 2001

Related U.S. Application Data

(60) Continuation of application No. 09/409,782, filed on Sep. 30, 1999, which is a division of application No. 09/001,404, filed on Dec. 31, 1997, now Pat. No. 6,235,551.

(51) Int. Cl.$^7$ ............................................. H01L 23/544
(52) U.S. Cl. ..................... 257/620; 257/623; 257/622; 257/626; 257/723; 257/618; 257/780; 257/690; 257/735; 257/786
(58) Field of Search ............................... 257/723, 780, 257/618, 620, 622, 623, 626, 690, 735, 786

(56) References Cited

U.S. PATENT DOCUMENTS

| | | | |
|---|---|---|---|
| 4,622,574 A | | 11/1986 | Garcia |
| 4,992,908 A | * | 2/1991 | Solomon .................... 361/400 |
| 5,146,308 A | | 9/1992 | Chance et al. |
| 5,266,833 A | | 11/1993 | Capps |
| RE34,794 E | | 11/1994 | Farnworth |
| 5,444,304 A | | 8/1995 | Hara et al. |
| 5,450,289 A | | 9/1995 | Kweon et al. |
| 5,451,815 A | | 9/1995 | Taniguchi et al. |
| 5,471,368 A | | 11/1995 | Downie et al. |
| 5,517,754 A | | 5/1996 | Beilstein, Jr. et al. |
| 5,592,019 A | | 1/1997 | Ueda et al. |
| 5,593,927 A | | 1/1997 | Farnworth et al. |
| 5,606,198 A | | 2/1997 | Ono et al. |
| 5,635,670 A | | 6/1997 | Kubota et al. |
| 5,635,760 A | | 6/1997 | Ishikawa |
| 5,661,087 A | | 8/1997 | Pedersen et al. |
| 5,668,409 A | | 9/1997 | Gaul |
| 5,863,813 A | | 1/1999 | Dando |
| 5,940,277 A | | 8/1999 | Farnworth et al. |
| 6,235,551 B1 | | 5/2001 | Farnworth et al. |

* cited by examiner

Primary Examiner—Minh Loan Tran
Assistant Examiner—Luan Thai
(74) Attorney, Agent, or Firm—TraskBritt

(57) ABSTRACT

A vertically mountable semiconductor device including at least one bond pad disposed on an edge thereof. The bond pad includes a conductive bump disposed thereon. The semiconductor device may also include a protective overcoat layer. The present invention also includes a method of fabricating the semiconductor device, including forming disconnected notches in a semiconductor wafer, redirecting circuit traces into each of the notches, and singulating the semiconductor wafer along the notches to form bond pads on the edges of the resultant semiconductor devices. A method of attaching the semiconductor device to a carrier substrate includes orienting the semiconductor device such that the bond pad is aligned with a corresponding terminal of the carrier substrate, and establishing an electrical connection between the bond pad and the terminal. Preferably, an electrically conductive material is disposed between the bond pad and the terminal to establish an electrically conductive bond between the semiconductor device and the carrier substrate.

18 Claims, 3 Drawing Sheets

SEMICONDUCTOR DEVICE INCLUDING EDGE BOND PADS AND METHODS

CROSS REFERENCE TO RELATED APPLICATIONS

This application is a continuation of application Ser. No. 09/409,782, filed Sep. 30, 1999, which is a divisional of application Ser. No. 09/001,404, filed Dec. 31, 1997, now U.S. Pat. No. 6,235,551, issued May 22, 2001.

BACKGROUND OF THE INVENTION

1. Field of the Invention

The present invention relates to vertically mountable, bare or minimally packaged semiconductor dice. In particular, this invention relates to semiconductor dice having bond pads on an edge thereof. More particularly, a preferred semiconductor device according to the present invention has all of its bond pads distributed along a single edge thereof. In use, upon vertical orientation and alignment of the semiconductor device upon a carrier substrate, an electrically conductive material establishes an electrical connection between each bond pad and a corresponding terminal of the carrier substrate.

2. State of the Art

The direct attachment of a semiconductor device to a circuit board is known in the art as chip-on-board technology. Semiconductor dice that are directly mountable to a circuit board typically include bond pads adjacent more than one edge thereof or in an area array over the active surface thereof. Methods for attaching dice directly to a circuit board include flip-chip technology and tape automated bonding. Typically, when such techniques are employed, a semiconductor device which includes bond pads on the active surface thereof is oriented over the circuit board and substantially parallel thereto so that an electrical connection will be established between the semiconductor device and the circuit board. After connecting such a semiconductor device to a circuit board, a protective coating may be applied over the semiconductor device.

However, the placement of a semiconductor device directly against a circuit board is somewhat undesirable in that, due to the parallel orientation of the semiconductor device relative to the circuit board, and the typical placement of the semiconductor device's active surface against the circuit board, the heat must pass through both the circuit board and the semiconductor device in order to transfer away from the semiconductor device. Thus, the transfer of heat away from the semiconductor device is relatively slow. The horizontal orientation of the semiconductor device also consumes a great deal of area or "real estate" on the circuit board. Moreover, chip-on-board attachments are typically permanent, making them somewhat undesirable from the standpoint that they are not readily user-upgradable.

Vertical surface mount packages are also known in the art. When compared with traditional, horizontally mountable semiconductor packages and chip-on-board devices, many vertical surface mount packages have a superior ability to transfer heat away from the semiconductor device. Vertical surface mount packages also consume less area on a circuit board than a horizontally mounted package of the same size. Thus, many skilled individuals in the semiconductor industry are finding vertical surface mount packages more desirable than their traditional, horizontally mountable counterparts.

The following United States patents disclose various exemplary vertical surface mount packages: Re. 34,794, issued to Warren M. Farnworth on Nov. 22, 1994; U.S. Pat. No. 5,444,304, issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Many vertical surface mount packages are somewhat undesirable in that they include leads which operatively connect a semiconductor device to a circuit board. The leads of such vertical surface mount packages tend to increase the impedance and decrease the overall speed with which the semiconductor device conducts electrical signals. Moreover, the packaging of many such vertical surface mount packages adds to their undesirability. Typically, packaging requires multiple additional manufacturing steps, which translates into increased production costs. The packaging of many vertical surface mount packages also tends to consume a substantial amount of area on the circuit board. Moreover, many vertical surface mount packages are not user-upgradable.

Some electronic devices have electrical contacts disposed on the edges thereof. Typically, such contacts are formed by drilling a hole through the substrate. The hole, or at least the perimeter thereof, is then filled with an electrically conductive material. Solders, molten metals and other electrically conductive materials are useful for filling the holes and forming the electrical contacts. When the substrate is separated into distinct boards or dice, the contacts are divided such that they are located on the edge of the distinct boards or dice. Such devices are illustrated and described in the following U.S. Pat. No. : 5,266,833 (the "'833 patent"), issued to David F. Capps on Nov. 30, 1993; U.S. Pat. No. 5,471,368 (the "'368 patent"), issued to Alan P. Downie et al. on Nov. 28, 1995; and U.S. Pat. No. 5,635,670 (the "'670 patent"), issued to Kenji Kubota et al. on Jun. 3, 1997.

The '833 patent also describes semiconductor dice having bond pads on the edges thereof. Such bond pads are formed by disposing a grid of "thin electrically conductive wires 14 formed of a suitable electrical conductive material, such as copper or gold, . . . in a semiconductor material during the growth of a semiconductor crystal 16." (Col. 4, lines 32–36).

In order to achieve appropriate bond pad placement, great consistency and accuracy are required in the orientation of the conductive wires during formation of the silicon ingot, singulation of the wafer, and fabrication of circuit traces on each semiconductor device. However, because the silicon is transferred after being sawed into wafers, it is somewhat difficult to maintain such consistency and accuracy in the placement of the wires. Further, such a method of forming edge-bound bond pads does not permit varying the bond pad placement on different wafers cut from the same ingot. U.S. Pat. No. 5,668,409 (the "'409 patent"), issued to Stephen Joseph Gaul on Sep. 16, 1997, discloses a vertically mountable, bare semiconductor die which includes bond pads along the edge thereof. The '409 patent discloses vertical mounting of that device to a circuit board by solder reflow techniques. However, that device is somewhat undesirable in that fabrication thereof requires several additional steps relative to the fabrication of typical chip-on-board semiconductor devices. The requirement of additional fabrication steps and the related requirement of additional fabrication materials increase the manufacturing cost of such semiconductor devices. Moreover, the disclosed use of solder reflow techniques to attach the semiconductor device of the '409 patent to a circuit board prohibits users from readily upgrading or otherwise replacing that semiconductor device.

Thus, a vertically mountable bare semiconductor device is needed which has reduced impedance relative to devices in the prior art, has good thermal conductivity, consumes less area or "real estate" on a circuit board, and is user-upgradable. A method of fabricating a semiconductor device with bond pads in select positions on the edges thereof with fewer steps is needed. A method of directly mounting an edge-bumped semiconductor device perpendicularly relative to a carrier substrate is also needed.

SUMMARY OF THE INVENTION

The vertically mountable, edge-bumped semiconductor device of the present invention addresses each of the foregoing needs.

The semiconductor device of the present invention includes bond pads disposed on the edges thereof. More preferable, the bond pads are disposed on a single edge of the semiconductor device. Placement of the bond pads on an edge of the semiconductor device facilitates direct vertical mounting of the semiconductor device to a carrier substrate. Thus, when such a semiconductor device is mounted perpendicularly relative to a carrier substrate, packaging and leads are not necessary to establish an electrical connection between the bond pads and the corresponding terminals on the carrier substrate. The direct connection between the bond pads of the semiconductor device and carrier substrate terminals also imparts the semiconductor device of the present invention with low impedance.

A fabrication method according to the present invention includes creating notches in a semiconductor wafer in locations where bond pads are desired and redirecting a circuit trace into selected notches. A protective overcoat may also be formed over the active surfaces of the dice. The metalized notches may be filled with a solder ball, other metal member or other electrically conductive material. The wafer is singulated along each of the metalized notches to form bond pads on the edges of each resultant semiconductor device.

An alignment device, which attaches the semiconductor device to a carrier substrate, includes a body which defines at least one slot therein, into which a semiconductor device is insertable. The alignment device may also include a mechanism for biasing the semiconductor device against a carrier substrate. Preferably, each slot is wider at its top opening than at its bottom opening, which abuts the carrier substrate, in order to facilitate insertion of a semiconductor device therein. The mechanism for biasing establishes and maintains electrical contact between the bond pads of the semiconductor device and the corresponding contacts of the carrier substrate.

Other advantages of the present invention will become apparent through a consideration of the appended drawings and the ensuing description.

BRIEF DESCRIPTION OF THE SEVERAL VIEWS OF THE DRAWINGS

FIG. 1b is a cross-section taken along line 1b—1b of FIG. 1a;

FIGS. 2a through 2f are cross-sectional views which illustrate a method of fabricating the semiconductor device of FIG. 1a;

DETAILED DESCRIPTION OF THE INVENTION

Figure 1A:
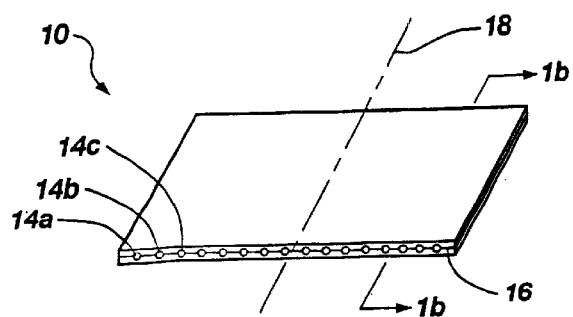
FIG. 1a is a perspective view of a first embodiment of a semiconductor device according to the present invention.
Figure 1B:
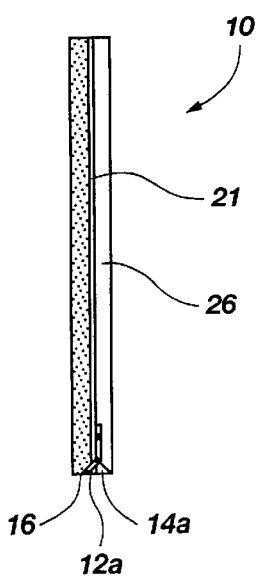

FIGS. 1a and 1b illustrate a semiconductor device 10 according to the present invention, which includes bond pads 12a, 12b, 12c, etc. disposed along a single edge 16 thereof. Thus, during the fabrication of semiconductor device 10, bond pads 12a, 12b, 12c, etc. are redirected to edge 16. Methods and mechanisms which are known to those of ordinary skill in the art are useful for manufacturing semiconductor device 10 and fabricating circuit traces which lead to bond pads 12a, 12b, 12c, etc. Preferably, the fabrication steps which precede the formation of the circuit traces that lead to the bond pads are unchanged from their equivalent steps in the fabrication of prior art semiconductor dice. Thus, existing semiconductor designs are useful in the semiconductor device with little reconfiguration.

Semiconductor device 10 may include a standardized number of bond pads 12a, 12b, 12c, etc., which are laterally spaced from one another at a standardized pitch, and which may be positioned at a specific location relative to a center line 18 of the semiconductor device, or relative to any other landmark on the semiconductor device, such as a side thereof. Alternatively, the pitch and number of bond pads may be nonstandardized. The placement of bond pads 12a, 12b, 12c, etc. on edge 16 imparts semiconductor device 10 with reduced impedance as the bond pads are electrically connected to a carrier substrate (reference character 40 of FIG. 4), relative to many vertical surface mount packages and other packaged semiconductor devices in the prior art.

Preferably, each of bond pads 12a, 12b, 12c, etc. includes a bump 14a, 14b, 14c, etc., respectively, formed thereon. Bumps 14a, 14b, 14c, etc. are preferably formed from gold, gold alloy, or a lead-based solder.

Figure 2C:
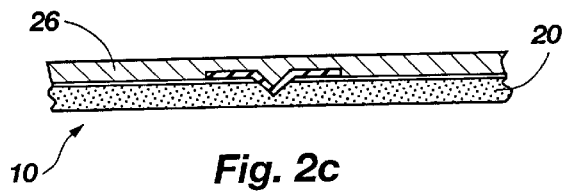
Figure 2D:
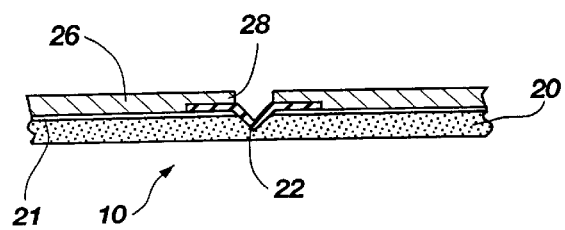
Figure 2A:
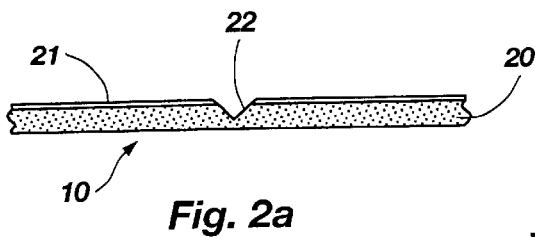

FIGS. 2a through 2f illustrate a first method of fabricating bond pads along the edge of semiconductor device 10. With reference to FIG. 2a, one or more disconnected notches 22 are formed in the active surface 21 of a semiconductor wafer 20. Preferably, notches 22 are formed only in locations upon semiconductor wafer 20 where bond pad placement is desired. Notches 22 are preferably formed by masking and silicon etching techniques that are known in the art, including, without limitation, photolithographic and plasma etching processes.

Preferably, a protective layer of silicon dioxide ($SiO_2$) is formed over active surface 21 of each semiconductor device 10 of semiconductor wafer 20 by techniques that are known in the art. The $SiO_2$ layer is then selectively etched at locations where electrical connection to circuit traces (described below) is desired.

Figure 2E:
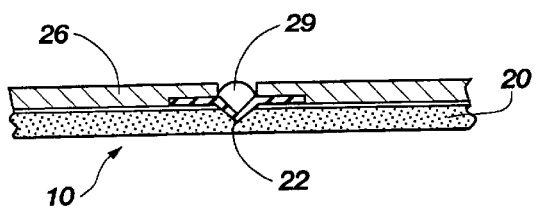
Figure 2B:
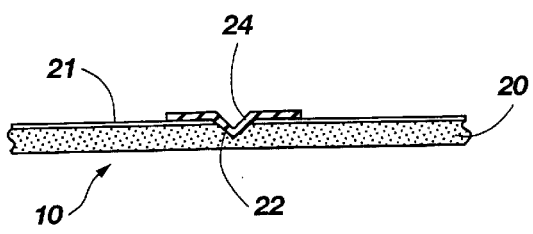

Referring now to FIG. 2b, circuit traces 24 are repatterned along active surface 21 of each semiconductor device 10 and into each notch 22. Preferably, circuit traces 24 are formed from aluminum, aluminum alloys, titanium tungsten (Ti:W) alloys, platinum, refractory metal suicides or other metals or metal alloys by sputtering techniques, which are known in the art.

As FIG. 2c illustrates, a protective overcoat 26 is then formed over semiconductor wafer 20. Preferably, protective overcoat 26 has a thickness of from about 5 microns to about 25 microns to impart strength and support to semiconductor device 10. Protective overcoat 26 is preferably a layer of polyimide, acrylate, epoxy potting compound, acrylic, silicone, polyurethane, another resin, or another protective coating material. Preferably, protective overcoat 26 is formed on or applied to semiconductor device 10 by methods which are known in the art, including, but not limited to, spin coating, spraying, flow coating, brush coating, and known polyimide application techniques.

Turning now to FIG. 2d, when protective overcoat 26 is formed from a material which is not readily removable from notches 22 following deposition and/or curing, a mask is employed to prevent the overcoat material from entering or curing in the notches. Thus, the protective overcoat forms a bond pad opening 28 around each notch 22. Polyimide layers may be applied over the entire active surface 21 of semiconductor wafer 20, removed from notches 22 by known photolithography methods to create bond pad openings 28 around each notch, then cured.

With reference to FIG. 2e, each notch 22 may be filled with an electrically conductive material, which is referred to as a conductive bump 29. Conductive bump 29 may be formed from solder (preferably a lead-based solder), gold, gold alloy or another electrically conductive material. Conductive bump 29 is formed by methods which are known in the art, including, without limitation, screen printing, stencil printing or pressure dispensing of solder pastes, solder reflow techniques, wave soldering, condensation soldering, infrared soldering, conductive soldering, and other solder processes.

Alternatively, protective overcoat 26 may be applied following the formation of conductive bumps 29 in each notch 22.

Figure 3:
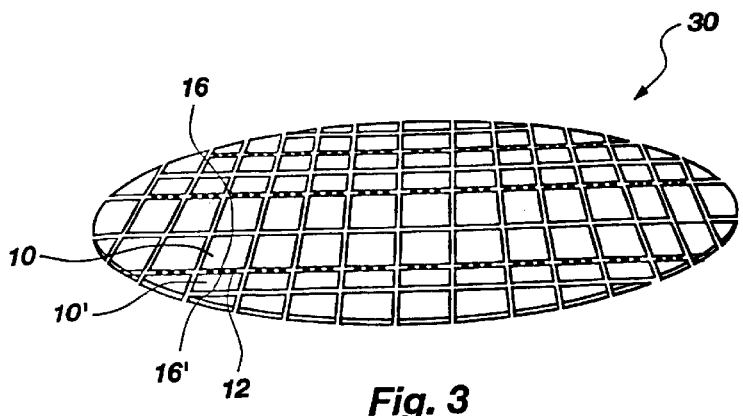
FIG. 3 is a perspective view of a singulated semiconductor wafer including bumped bond pads on the edges of the semiconductor dice thereof.
Figure 2F:
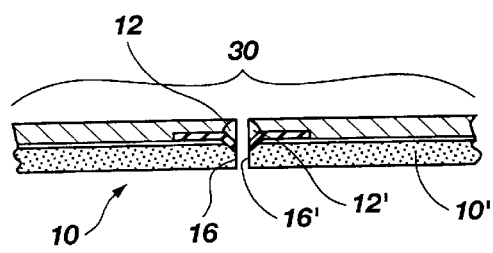

FIGS. 2f and 3 depict a singulated semiconductor wafer 30. Semiconductor wafer 30 is preferably singulated by sawing. During singulation of semiconductor wafer 30, several semiconductor devices 10 and 10' are formed, having adjacent edges 16 and 16'. Conductive bump 29 is also severed, forming bond pads 12 and 12' on edges 16 and 16', respectively.

Figure 4A:
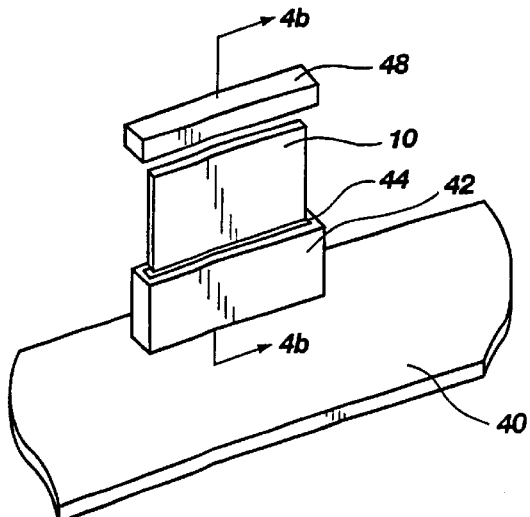
FIG. 4a is an assembly view of the semiconductor device of FIG. 1a, an alignment device for orienting the semiconductor device relative to a carrier substrate, the carrier substrate, and a cover which may be disposed over the alignment device.
Figure 4B:
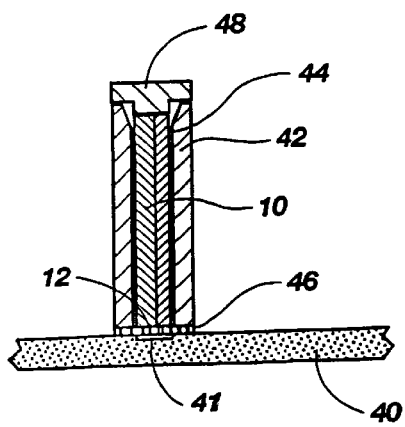
FIG. 4b is a cross-section of the alignment device, taken along line 4b–4b of FIG. 4a, which illustrates an embodiment of attachment of the semiconductor device to a carrier substrate.

Referring to FIGS. 4a and 4b, an alignment device 42 supports one or more semiconductor devices 10 relative to a carrier substrate 40. Alignment device 42 has one or more slots 44 formed completely therethrough (i.e., each slot opens to both the top and bottom surfaces of the alignment device). Preferably, each slot 44 tapers outward towards the top portion thereof, such that the top of the slot is the largest portion thereof. Thus, the taper facilitates the insertion of a semiconductor device 10 into slot 44. Preferably, an electrically conductive material 46, such as a z-axis elastomer or a solder joint, is positioned at the bottom of slot 44, against carrier substrate 40, to establish an electrical connection between each bond pad 12 of semiconductor device 10 and its respective terminal 41 on the carrier substrate 40.

Preferably, the total side tolerance between semiconductor device 10 and slot 44 is about 10 mils to about 40 mils, such that the semiconductor device is readily insertable into and removable from the slot. Nevertheless, due to carrier substrate "real estate" consumption considerations, alignment device 42 should be, preferably, as narrow as possible. As a semiconductor device 10 is inserted into alignment device 42, downward pressure on the semiconductor device against electrically conductive material 46 biases the semiconductor device relative to the electrically conductive material to establish an electrical connection between the bond pads 12 of the semiconductor device and their respective terminals 41. Alternatively, each slot 44 may be adapted to receive a plurality of dice.

Alignment device 42 may also include a cover 48, which encloses semiconductor device 10 disposed within slot 44. Cover 48 may also be adapted to bias semiconductor device 10 against carrier substrate 40 to maintain the electrical connection between bond pads 12 and their respective terminals 41.

Preferably, alignment device 42 is manufactured from a material with good thermal conductivity, including, without limitation, copper, aluminum, other metals, metal alloys, and ceramics.

Figure 5:
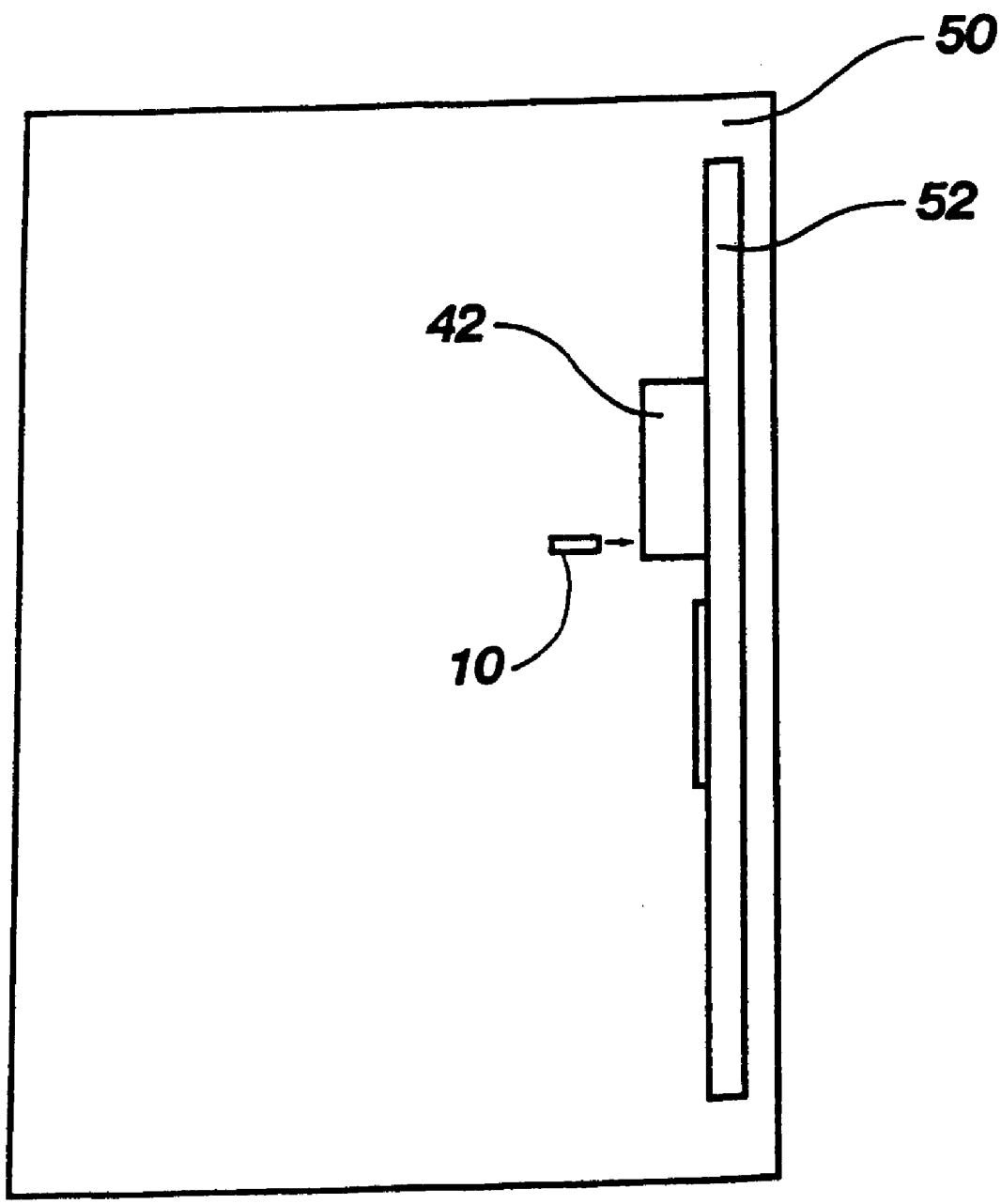
FIG. 5 is a schematic representation of the semiconductor device in a computer.

FIG. 5 illustrates a computer 50 including a carrier substrate 52. Alignment device 42 is attached to carrier substrate 52. One or more semiconductor devices 10 are inserted into alignment device 42 and biased against electrically conductive material 46 in order to establish an electrical connection between the devices and the carrier substrate. Thus, with the attachment of a semiconductor device 10 to carrier substrate 52, the semiconductor device is operatively incorporated into computer 50.

The vertically mountable, edge-bumped semiconductor device of the present invention includes several advantageous features. The placement of bond pads on a single edge of the semiconductor device eliminates the need for leads between the bond pads and their respective terminals on a carrier substrate. Thus, the semiconductor device has reduced impedance relative to many devices in the prior art. The vertical orientation of the semiconductor device relative to a substrate imparts the semiconductor device with good thermal transferability and consumes relatively little area or "real estate" on the carrier substrate. The protective overcoat supports the semiconductor device and strengthens it as it is biased against a carrier substrate to establish an electrical contact between the semiconductor device and the carrier substrate. The fabrication method facilitates selection of the bond pad sites on a semiconductor device and may be performed in relatively few steps.

Although the foregoing description contains many specificities, these should not be construed as limiting the scope of the present invention, but merely as providing illustrations of selected presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. A semiconductor die, comprising:
    an active surface;
    a first layer comprising protective material over said active surface;
    a plurality of peripheral edges, at least one peripheral edge of said plurality of peripheral edges including at least one disconnected notch formed in at least a portion thereof, said at least one disconnected notch extending from a portion of said active surface of the semiconductor die and terminating at said at least one peripheral edge;
    at least one circuit trace traversing a portion of said first layer to said at least one disconnected notch;

at least one bond pad disposed at least partially on said at least one circuit trace and forming a connector for mounting the semiconductor die nonparallel relative to a substrate with said at least one bond pad contacting a portion of said substrate; and a second layer comprising protective material covering at least a portion of said first layer and at least a portion of said at least one circuit trace.

2. The semiconductor die of claim 1, wherein said at least one bond pad comprises solder.

3. The semiconductor die of claim 1, comprising a plurality of bond pads.

4. The semiconductor die of claim 3, wherein each of said plurality of bond pads is disposed on a single peripheral edge of said plurality of peripheral edges.

5. A chip-on-board assembly, comprising:

a carrier substrate having at least one conductive terminal thereon; and a semiconductor die mountable on said carrier substrate, said semiconductor die including:
an active surface;
a first layer of protective material covering at least a portion of said active surface;
a plurality of edges forming a periphery of said semiconductor die, at least one edge of said plurality of edges including a disconnected notch formed in at least a portion thereof, said disconnected notch extending from a portion of the active surface of said semiconductor die and terminating at said at least one edge;
at least one circuit trace extending onto at least a portion of said disconnected notch;
a second layer of protective material covering said at least a portion of said active surface and at least a portion of said at least one circuit trace; and
at least one bond pad disposed at least partially on said at least one circuit trace, said at least one bond pad forming a connector for mounting said semiconductor die nonparallel relative to said carrier substrate, said at least one bond pad located correspondingly to said at least one conductive terminal.

6. The chip-on-board assembly of claim 5, further comprising a quantity of electrically conductive material disposed between said at least one bond pad and said at least one conductive terminal.

7. The chip-on-board assembly of claim 6, wherein said quantity of electrically conductive material comprises a z-axis elastomer.

8. The chip-on-board assembly of claim 6, wherein said quantity of electrically conductive material comprises solder.

9. The chip-on-board assembly of claim 5, wherein said at least one bond pad and said at least one conductive terminal communicate by way of an interference contact.

10. The chip-on-board assembly of claim 5, further comprising an alignment device disposed on said carrier substrate, said semiconductor die being at least partially disposable within a receptacle of said alignment device.

11. The chip-on-board assembly of claim 10, wherein said alignment device aligns said at least one bond pad with said at least one conductive terminal upon disposal of said semiconductor die at least partially within said receptacle.

12. The chip-on-board assembly of claim 5, wherein, upon assembly of said semiconductor die with said carrier substrate, at least a portion of said at least one bond pad contacts at least a portion of said at least one conductive terminal.

13. The chip-on-board assembly of claim 5, wherein said semiconductor die comprises an overcoat layer over at least a portion of at least said active surface thereof.

14. A semiconductor die, comprising:
an active surface;
a first protective layer covering at least a portion of said active surface;
a plurality of edges forming a periphery of said semiconductor die, a single edge of said plurality of edges including a disconnected notch formed therein, said disconnected notch extending from a portion of said active surface of the semiconductor die and terminating at said single edge;
at least one circuit trace extending onto at least a portion of said disconnected notch;
a second protective layer covering at least a portion of said active surface and at least a portion of said at least one circuit trace; and
a bond pad disposed at least partially on said at least one circuit trace, said bond pad forming a connector for mounting said semiconductor die nonparallel relative to a carrier substrate.

15. The semiconductor die of claim 14, wherein, upon assembly of said semiconductor die with said carrier substrate, at least a portion of said bond pad contacts at least a portion of at least one conductive terminal of said carrier substrate.

16. The semiconductor die of claim 14, further comprising an overcoat layer over over at least a portion of at least said active surface.

17. The semiconductor die of claim 14, wherein said bond pad comprises solder.

18. The semiconductor die of claim 14, comprising a plurality of notches and a corresponding plurality of bond pads therein.

* * * * *

UNITED STATES PATENT AND TRADEMARK OFFICE
CERTIFICATE OF CORRECTION

PATENT NO. : 6,414,374 B2  
DATED : July 2, 2002  
INVENTOR(S) : Warren M. Farnworth, Larry D. Kinsman and Walter L. Moden It is certified that error appears in the above-identified patent and that said Letters Patent is hereby corrected as shown below:

Title page,  
Item [57], ABSTRACT,  
Line 14, delete the comma after "substrate"

Column 4,  
Line 65, change "suicides" to -- silicides --

Signed and Sealed this

Twenty-ninth Day of July, 2003

JAMES E. ROGAN  
*Director of the United States Patent and Trademark Office*